(12) United States Patent
Lin et al.

(10) Patent No.: US 12,313,892 B2
(45) Date of Patent: May 27, 2025

(54) TECHNIQUES FOR THERMAL MANAGEMENT WITHIN OPTICAL SUBASSEMBLY MODULES

(71) Applicant: Applied Optoelectronics, Inc., Sugar Land, TX (US)

(72) Inventors: Kai-Sheng Lin, Sugar Land, TX (US); Yi Wang, Katy, TX (US); John Cheng, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 973 days.

(21) Appl. No.: 16/987,096

(22) Filed: Aug. 6, 2020

(65) Prior Publication Data

US 2022/0045478 A1     Feb. 10, 2022

(51) Int. Cl.
| | |
|---|---|
| G02B 6/42 | (2006.01) |
| H01S 5/023 | (2021.01) |
| H01S 5/024 | (2006.01) |
| H01S 5/02345 | (2021.01) |
| H01S 5/0239 | (2021.01) |

(52) U.S. Cl.
CPC ......... *G02B 6/4271* (2013.01); *G02B 6/4273* (2013.01); *H01S 5/023* (2021.01); *H01S 5/02415* (2013.01); *G02B 6/425* (2013.01); *G02B 6/4292* (2013.01); *H01S 5/02345* (2021.01); *H01S 5/0239* (2021.01); *H01S 5/02453* (2013.01)

(58) Field of Classification Search
CPC .. H01S 5/023; H01S 5/02415; H01S 5/02345; H01S 5/0239; H01S 5/02453; G02B 6/4271; G02B 6/4273; G02B 6/425; G02B 6/4292; G02B 6/4246

See application file for complete search history.

(56) References Cited

U.S. PATENT DOCUMENTS

| | | | | |
|---|---|---|---|---|
| 6,146,025 A | * | 11/2000 | Abbink | G02B 6/4269 |
| | | | | 385/88 |
| 6,252,726 B1 | * | 6/2001 | Verdiell | H01S 5/02208 |
| | | | | 385/94 |
| 8,774,568 B2 | * | 7/2014 | Han | G02B 6/4206 |
| | | | | 398/199 |
| 9,548,817 B1 | * | 1/2017 | Nagarajan | H01S 5/0064 |

(Continued)

OTHER PUBLICATIONS

Chinese Office Action with English translation, issued Aug. 31, 2023 in Chinese Application No. 202110779740.X, 6 pgs.

*Primary Examiner* — M. A. Golub-Miller
(74) *Attorney, Agent, or Firm* — Grossman Tucker Perreault & Pfleger, PLLC; Norman S. Kinsella

(57) ABSTRACT

The present disclosure is generally directed to techniques for thermal management within optical subassembly modules that include thermally coupling heat-generating components, such as laser assemblies, to a temperature control device, such as a thermoelectric cooler, without the necessity of disposing the heat-generating components within a hermetically-sealed housing. Accordingly, this arrangement provides a thermal communication path that extends from the heat-generating components, through the temperature control device, and ultimately to a heatsink component, such as a sidewall of a transceiver housing, without the thermal communication path extending through a hermetically-sealed housing/cavity.

11 Claims, 12 Drawing Sheets

(56) References Cited

U.S. PATENT DOCUMENTS

| | | | |
|---|---|---|---|
| 10,615,567 B1* | 4/2020 | Gelhausen | H04B 10/504 |
| 10,698,168 B1* | 6/2020 | Lin | G02B 6/4256 |
| 10,833,775 B1* | 11/2020 | Wang | G02B 6/4277 |
| 10,928,600 B2* | 2/2021 | Liu | H01S 5/02469 |
| 10,948,671 B2* | 3/2021 | Lin | H04J 14/0256 |
| 10,951,005 B2* | 3/2021 | Wang | H01S 5/02253 |
| 10,989,870 B2* | 4/2021 | Lin | H04B 10/503 |
| 11,177,887 B2* | 11/2021 | Lin | H04B 10/801 |
| 11,682,878 B2* | 6/2023 | Lin | H04B 10/503 |
| | | | 372/35 |
| 2003/0174454 A1* | 9/2003 | Fu | G02B 6/4273 |
| | | | 361/103 |
| 2005/0214957 A1* | 9/2005 | Kihara | H01S 5/02216 |
| | | | 438/106 |
| 2007/0189677 A1* | 8/2007 | Murry | G02B 6/4279 |
| | | | 385/92 |
| 2013/0279115 A1* | 10/2013 | Blumenthal | H05K 7/20336 |
| | | | 361/700 |
| 2014/0003457 A1* | 1/2014 | Shastri | H01S 5/4025 |
| | | | 361/717 |
| 2014/0126917 A1* | 5/2014 | Sato | G02B 6/4265 |
| | | | 398/182 |
| 2014/0345297 A1* | 11/2014 | Saeki | H01S 5/02251 |
| | | | 62/3.6 |
| 2015/0125162 A1* | 5/2015 | Pfnuer | G02B 6/4271 |
| | | | 398/201 |
| 2016/0377822 A1* | 12/2016 | Zheng | G02B 6/2938 |
| | | | 385/14 |
| 2017/0307837 A1* | 10/2017 | Gektin | G02B 6/4272 |
| 2018/0331494 A1* | 11/2018 | Ho | H04B 10/503 |
| 2019/0361181 A1* | 11/2019 | Law | G02B 6/4271 |
| 2020/0052461 A1* | 2/2020 | Belley | H01S 5/0238 |
| 2020/0319416 A1* | 10/2020 | Patel | G02B 6/4248 |
| 2021/0104865 A1* | 4/2021 | Hu | H01S 5/4087 |
| 2021/0132305 A1* | 5/2021 | Noguchi | G02B 6/4281 |
| 2022/0045472 A1* | 2/2022 | Lin | H01S 5/02453 |
| 2022/0317394 A1* | 10/2022 | Huang | G02B 6/428 |
| 2023/0103569 A1* | 4/2023 | Tang | H01S 5/02415 |
| | | | 372/36 |

* cited by examiner

TECHNIQUES FOR THERMAL MANAGEMENT WITHIN OPTICAL SUBASSEMBLY MODULES

RELATED APPLICATIONS

The present disclosure is related to co-pending application Ser. No. 16/987,126 titled "TECHNIQUES FOR THERMAL MANAGEMENT WITHIN OPTICAL SUBASSEMBLY MODULES AND A HEATER DEVICE FOR LASER DIODE TEMPERATURE CONTROL" which was concurrently filed with the instant application and is incorporated herein by reference in its entirety.

TECHNICAL FIELD

The present disclosure relates generally to optical communications, and more particularly, to techniques for providing thermal management within optical subassembly modules to minimize or otherwise reduce conditions giving rise to condensation without the necessity of hermetically-sealed housings to protect components, and a heater device for laser diode (LD) temperature control.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher transmit/receive speeds in increasingly space-constrained optical transceiver modules has presented challenges, for example, with respect to thermal management, insertion loss, RF driving signal quality and manufacturing yield.

Optical transceiver modules generally include one or more transmitter optical subassemblies (TOSAs) for transmitting optical signals. TOSAs can include one or more lasers to emit one or more channel wavelengths and associated circuitry for driving the lasers. In optical applications such as long-distance communication and scenarios where condensation can form within optical transceiver module housings, for example, hermetically-sealed housings can be implemented to mitigate the potential for performance loss and component degradation. However, the inclusion of hermetically-sealed components increases manufacturing complexity, cost, and raises numerous non-trivial challenges within space-constrained housings.

BRIEF DESCRIPTION OF THE DRAWINGS

These and other features and advantages will be better understood by reading the following detailed description, taken together with the drawings wherein.

DETAILED DESCRIPTION

Figure 1:
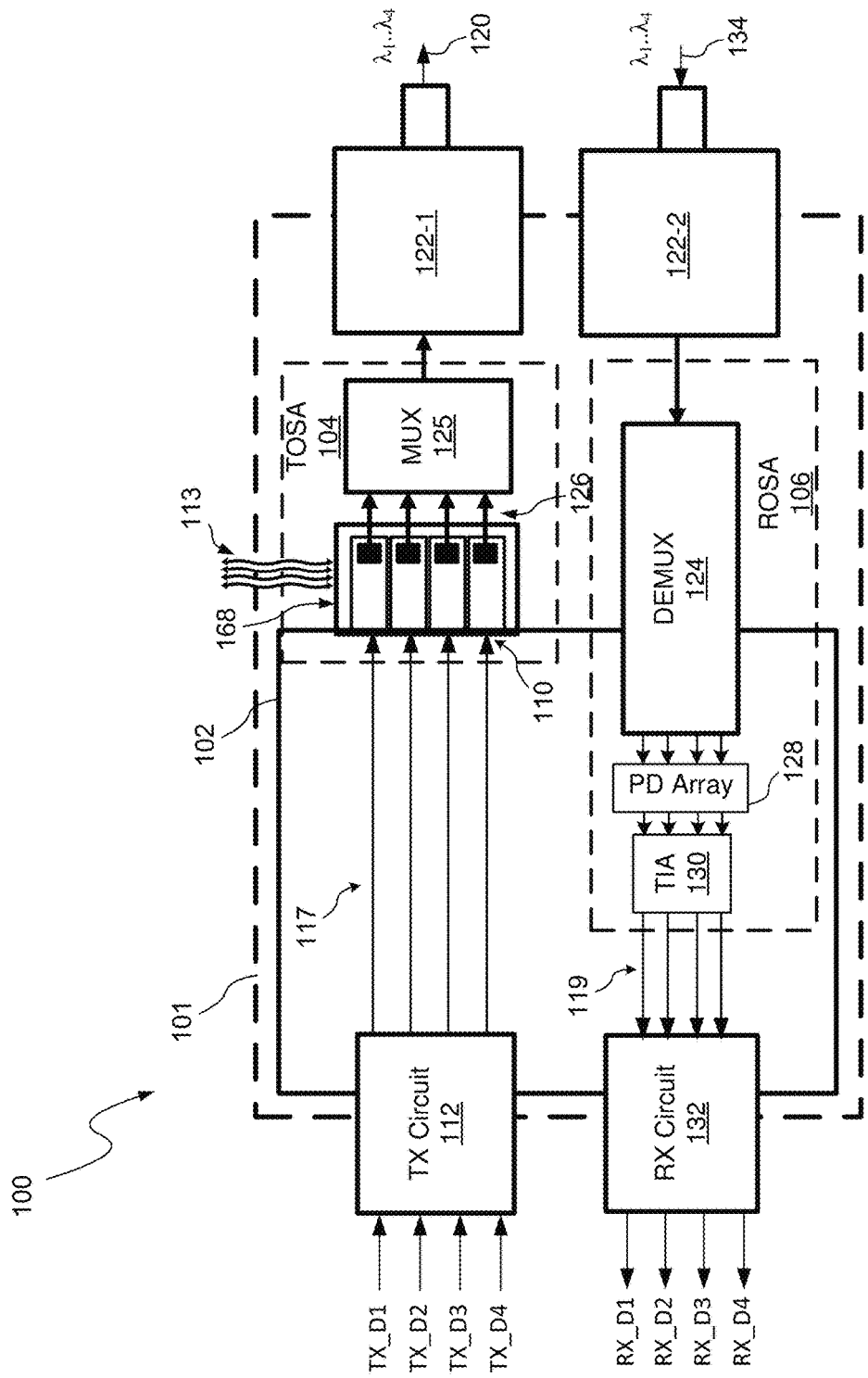
FIG. 1 is a block diagram of an optical transceiver module, consistent with embodiments of the present disclosure.

As discussed above, existing optical subassembly modules such as TOSAs include hermetically-sealed housings and components to, among other things, reduce the potential for moisture/condensation to form and potentially degrade optical performance and/or component lifespan. In addition, hermetically-sealed housings and components may also be utilized in combination with temperature control devices to maintain nominal optical performance. For example, in the context of TOSAs that utilize electro-absorption modulated lasers (EMLs), hermetically-sealed housings and temperature control devices such as thermoelectric coolers (TECs) often get implemented to regulate temperature and maintain nominal optical performance. However, such hermetically-sealed housings increase both manufacturing complexity and costs. Continued advancements in scaling of optical transceiver modules to increase component density, reducing manufacturing costs and complexity, and increasing power efficiency depends at least in part on thermal management approaches that reduce or otherwise eliminate the necessity of hermetically-sealed housings.

Thus, the present disclosure is generally directed to techniques for thermal management within optical subassembly modules that include thermally coupling heat-generating components, such as laser assemblies, to a temperature control device, such as a thermoelectric cooler, without the necessity of disposing the heat-generating components within a hermetically-sealed housing. Accordingly, this arrangement provides a thermal communication path that extends from the heat-generating components, through the temperature control device, and ultimately to a heatsink component (e.g., a sidewall of a transceiver housing), without the thermal communication path extending through a hermetically-sealed housing/cavity.

The present disclosure has identified that conditions giving rise to condensation in an optical subassembly module tend to occur when transitioning from a relatively warm temperature internal temperature, e.g., 60-70 degrees Celsius (C.) to temperatures below a dew point.

Thus, aspects of the present disclosure include utilizing an external temperature control system, e.g., an HVAC system, to maintain an ambient temperature of an environment surrounding one or more optical subassembly modules implementing thermal management techniques consistent with the present disclosure. The one or more optical subassembly modules may then be held by such external temperature control systems at a target temperature, also referred to herein as a global temperature. In an embodiment, the HVAC system maintains the global temperature for the surrounding environment at 55±20° C., preferably 55±10° C., and more preferably at 55±2° C. An optical transceiver module consistent with the present disclosure may then maintain a target local temperature (which may also be referred to herein as a local operating temperature or simply an operating temperature) that is 10-25° C. greater than the global temperature, and preferably, at least 20° C. greater than the global temperature via an associated temperature control device disposed within the optical transceiver module. Accordingly, the optical transceiver module may maintain temperatures within a cavity defined by the same between 65-80° C., and preferably at 75±5° C. Thus, the optical transceiver module may then minimize or otherwise reduce conditions giving rise to condensation by maintaining the local temperature above, or equal, to that of the global temperature.

Aspects of the present disclosure also include preferably thermally isolating a substrate, such as a printed circuit board assembly (PCBA), from a temperature control device within an optical subassembly housing. Thus, the substrate can be utilized to couple to and support various optical subassembly components such as ROSA and TOSA components that are relatively temperature-sensitive, without communicating heat to the substrate that could interfere with such temperature-sensitive components.

In one preferred example, a region of a PCBA gets sandwiched between a plurality of laser assemblies and a thermoelectric cooler (TEC). In this example, the plurality of laser assemblies (directly) thermally couple to the TEC by extending through one or a plurality of openings defined by the PCBA. Further, at least one layer of a thermally insulating material is disposed on the PCBA to thermally isolate the PCBA from the TEC. Accordingly, one or a plurality of thermal communication paths can extend between the plurality of laser assemblies and the TEC without passing through the PCBA. Preferably, the one or plurality of thermal communication paths extend along an axis that is substantially transverse relative to the longitudinal axis of the substrate, and more preferably, extend along an axis on which the TEC and plurality of laser assemblies are disposed to provide a relatively straight/direct thermal communication path.

In addition, the layer of thermally insulating material may also act as a heat conduit to channel heat towards the thermal communication path to increase thermal communication and reduce the amount of heat communicated into the PCBA. Alternatively, or in addition, a gap is disposed between the PCBA and the TEC. The gap may be provided by, for example, one or a plurality of pedestals provided by the plurality of laser assemblies to provide a mounting surface for the TEC that is offset from the PCBA.

Aspects of the present disclosure also include a laser submount (also referred to herein as an LD submount) for use within transmitter optical subassemblies (TOSAs) such as the optical transceiver module 100 discussed below. The laser submount comprises a substrate, a laser diode (LD) coupled to the substrate, a first electrically conductive path disposed on the substrate to electrically couple the LD to LD driving circuitry, and a heater device disposed on the substrate. The heater device preferably includes a base with a resistive heating element and an electrical conductor disposed thereon. More preferably, the electrical conductor is disposed on the resistive heating element with a layer of electrically insulating material disposed therebetween to allow for the electrical conductor to thermally couple to, and be electrically isolated from, the resistive heating element. The electrical conductor can provide at least a portion of the first electrically conductive path to electrically couple the LD with the LD driving circuitry. The heater device can be configured to communicate heat generated by the resistive heating element to the LD, and preferably, the lasing region or modulator region of the LD, based on an electrical interconnect that electrically couples the LD to the electrical conductor. Preferably, the electrical interconnect comprises a wire bond or any other suitable electrical interconnect that can communicate both an electrical driving/radio frequency (RF) signal and heat generated by the resistive heating element.

Thus, the laser submount advantageously provides a heater device that provides a portion of the first electrically conductive path to couple the LD to LD driving circuitry. The heater device then communicates generated heat to the LD, and preferably a lasing and/or a modulator region of the LD, via the first electrically conductive path. Integrating the heater device into the electrically conductive path advantageously reduces the footprint of the heater device on the LD submount and allows for greater component density and continued scaling of optical subassemblies.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM.

The term "coupled" as used herein refers to any connection, coupling, link or the like and "optically coupled" refers to coupling such that light from one element is imparted to another element. Likewise, the term "thermally coupled" as used herein refers to any connection, coupling, link or the like between elements such that heat from one element is imparted to another element. Such "coupled" devices are not necessarily directly connected to one another and may be separated by intermediate components or, in the context of optical coupling, devices that may manipulate or modify such signals. On the other hand, the term "direct optical coupling" refers to an optical coupling via an optical path between two elements that does not include such intermediate components or devices, e.g., a mirror, waveguide, and so on, or bends/turns along the optical path between two elements. Likewise, the term "direct thermal coupling" or "directly thermally coupled" refers to a coupling that communicates heat between two elements that does not include an intermediate component or device (including air and other gasses).

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated/target characteristic. To provide one non-limiting numerical example to quantify "substantially," such a modifier is intended to include minor variation that can cause a deviation of up to and including ±5% from a particular stated quality/characteristic unless otherwise provided by the present disclosure.

As used herein, the terms hermetic-sealed and hermetically-sealed may be used interchangeably and refer to a housing that, for example, releases a maximum of about $5*10^{-8}$cc/sec of filler gas. The filler gas may comprise an inert gas such as nitrogen, helium, argon, krypton, xenon, or various mixtures thereof, including a nitrogen-helium mix, a neon-helium mix, a krypton-helium mix, or a xenon-helium mix.

The use of the terms "first," "second," and "third" when referring to elements herein are for purposes of clarity and distinguishing between elements, and not for purposes of limitation. Likewise, like numerals are utilized to reference like elements/components between figures.

Referring to the Figures, FIG. 1 shows a block diagram of an optical transceiver module 100 consistent with embodiments of the present disclosure. As shown, the optical transceiver module 100 includes a plurality of components disposed within housing 101, which may also be referred to as an optical transceiver housing or an optical subassembly housing. Preferably, the housing 101 is implemented as a small-form factor pluggable (SFFP) transceiver housing.

As shown, the housing 101 of the optical transceiver module 100 includes a transmitter optical subassembly (TOSA) arrangement 104 and a receiver optical subassembly (ROSA) arrangement 106 coupled to a substrate 102, which may also be referred to herein as an optical module substrate.

The substrate 102 may comprise, for example, a printed circuit board (PCB), and preferably a PCB assembly (PCBA). Preferably, an end of the substrate 102 is configured to extend from the housing 101 to allow for "pluggable" insertion of the optical transceiver module 100 into a transceiver cage (not shown) and electrical interconnection with external driving circuitry, for example.

Preferably, the TOSA and ROSA arrangements 104, 106 are implemented as multi-channel subassemblies configured to send and receive, respectively, N channel wavelengths and achieve overall transmission speeds of at least 40 Gigabits per second (Gb/s). More preferably, the TOSA and ROSA arrangements 104, 106 are configured to send and receive, respectively, four (4) different channel wavelengths and achieve overall transmission speeds of at least 400 Gb/s. Other channel configurations and transmission speeds are within the scope of this disclosure. The TOSA arrangement 104 may therefore also be referred to herein as a multi-channel TOSA arrangement and the ROSA arrangement 106 may also be referred to as a multi-channel ROSA arrangement.

As shown in FIG. 1, the optical transceiver module 100 transmits and receives four (4) channels using four different channel wavelengths ($\lambda 1 \ldots \lambda 4$) via the TOSA arrangement 104 and the ROSA arrangement 106, respectively, and is capable of transmission rates of at least about 25 Gbps per channel, and preferably, 50 Gbps per channel. The optical transceiver module 100 may also be capable of transmission distances of 2 km to at least about 10 km. The optical transceiver module 100 may be used, for example, in internet data center applications or fiber to the home (FTTH) applications. Although the following examples and embodiments show and describe a 4-channel optical transceiver module, this disclosure is not limited in this regard.

As further shown, the optical transceiver module 100 includes a transmit connecting circuit 112 to provide electrical connections to the plurality of laser assemblies 110 and drive the same. The transmit connecting circuit 112 may be configured to receive driving signals (e.g., TX_D1 to TX_D4) from, for example, external driving circuitry provided by a transceiver cage (not shown). A plurality of transit (TX) traces 117 (also referred to herein as electrically conductive paths) may be patterned on a component mounting surface of the substrate 102 to bring the transmit connecting circuit 112 into electrical communication with the plurality of laser assemblies 110. The substrate 102 can include other components and conductive traces depending on a desired configuration. For example, and as discussed in greater detail below, the substrate 102 can include terminals to electrically couple the temperature control device 168 with a power rail. Notably, the temperature control device 168 and/or the plurality of laser assemblies 110 do not necessarily require a feedthrough device for electrical interconnection with power and driving circuitry, thus reducing manufacturing complexity and simplifying routing of electrical interconnects relative to other approaches that implement TOSAs within hermetically-sealed housings.

In the example of FIG. 1, the TOSA arrangement 104 includes a plurality of laser assemblies 110 and a multiplexing device 125. Each of the plurality of laser assemblies 110 include at least one laser diode (LD) implemented as, for example, a direct modulated laser or an EML, and preferably, at least one EML laser. Each laser assembly of the plurality of laser assemblies 110 can further include passive and/or active optical components such as an optical isolator, focus lens, monitor photodiode (MPD), as is discussed in greater detail below.

The multiplexing device 125 comprises an arrayed waveguide grating (AWG) or any other suitable device for combining a plurality of channel wavelengths and outputting a multiplexed optical signal via external transmit waveguide 120. The multiplexing device 125 may therefore include a plurality of input ports optically coupled to the plurality of laser assemblies 110 and be configured to receive channel wavelengths 126 emitted by the same, and an output port optically coupled to optical coupling receptacle 122-1 by way of an intermediate waveguide, such as an optical fiber. The optical coupling port 122-1 may comprise, for example, an LC port, or any other port for optically coupling to one or more external transmit waveguides, e.g., external transmit waveguide 120.

As further shown, the TOSA arrangement 104 includes a temperature control device 168 thermally coupled to the plurality of laser assemblies 110. The temperature control device 168 preferably directly thermally couples with the plurality of laser assemblies 110 as is discussed in further detail below. The temperature control device 168 can be implemented as a thermoelectric cooler (TEC) device having a plurality of semiconductor elements (or Pelletier elements) sandwiched between two or more plates. In this example, the temperature control device 168 may be configured to selectively increase and decrease the temperature of the plurality of laser assemblies 110 to maintain a target local temperature. More preferably, the temperature control device 168 is implemented within the housing 101 without being disposed in, or otherwise coupled to, a hermetically-sealed housing/cavity. The temperature control device 168 can define a first thermal communication path generally shown at 113 that extends from the plurality of laser assemblies 110 to the housing 101 for heat dissipation purposes.

In operation, the TOSA arrangement 104 may then receive driving signals (e.g., TX_D1 to TX_D4), and in response thereto, generate and launch multiplexed channel wavelengths on to the external transmit waveguide 120, preferably implemented as an optical fiber, by way of optical coupling receptacle 122-1.

The present disclosure has identified that conditions giving rise to moisture/condensation within the housing 101 may be mitigated via a thermal management approach that does not require implementing the TOSA arrangement 104, whole or in part, within a hermetically-sealed cavity. Therefore, the TOSA arrangement 104 is preferably not disposed within a hermetically-sealed cavity/housing, and instead, is disposed in an atmosphere within the cavity of the housing 101 shared by each component therein. The atmosphere of the cavity in which the TOSA arrangement 104 is disposed may therefore comprise substantially oxygen, and have a composition and atmospheric pressure substantially identical to the external atmosphere surrounding the optical transceiver module 100. Stated differently, the TOSA arrangement 104 is preferably not disposed within a pressurized housing.

For in-door or otherwise temperature controlled environments surrounding the optical transceiver module 100, e.g., featuring an HCAV system, such external atmospheres may be kept at substantially a nominal ambient temperature (also referred to herein as a global temperature) of 50 degrees Celsius or less. In this example, the temperature control device 168 may therefore be configured to maintain a target local temperature for the plurality of laser assemblies 110 by, for instance, heating the same until the target local temperature is reached. In the context of the plurality of laser assemblies 110 being implemented with EML lasers, for example, the target local temperature may be between 20 and 70 degrees Celsius. Preferably, the temperature control device 168 is configured to increase the temperature of the plurality of laser assemblies 110 by at least 20 degrees Celsius relative to the global temperature of the environment surrounding the optical transceiver module 100.

Condensation conditions tend to occur when relatively warm components of the optical transceiver module 100 begin to cool. Accordingly, conditions giving rise to condensation are minimized or otherwise reduced by the temperature control device 168 maintaining the plurality of laser assemblies 110 above the global temperature, e.g., at the target local temperature, and maintaining the plurality of laser assemblies 110 within ±20 degrees Celsius of the target local temperature, preferably within ±5 degrees Celsius, and more preferably within ±2 degrees Celsius of the target local temperature.

Continuing on, the ROSA arrangement 106 preferably includes a demultiplexing device 124, a photodiode (PD) array 128, and amplification circuitry 130. The demultiplexing device 124 is preferably implemented as an arrayed waveguide grating, and the amplification circuitry 130 is preferably configured as at least one transimpedance amplifier (TIA). An input port of the demultiplexing device 124 may be optically coupled with an external receive waveguide 134, e.g., implemented as an optical fiber, by way of an optical coupling receptacle 122-2. Optical coupling receptacle 122-2 is preferably implemented as an LC port, although other types of optical coupling ports are within the scope of this disclosure. An intermediate waveguide, such as an optical fiber, optically couples the optical coupling receptacle 122-2 with the demultiplexing device 124.

An output port of the demultiplexing device 124 is preferably configured to output separated channel wavelengths on to the PD array 128. The PD array 128 may then output proportional electrical signals to the amplification circuitry 130, which then may be amplified and otherwise conditioned. The PD array 128 and the amplification circuitry 130 can detect and convert optical signals into electrical data signals (RX_D1 to RX_D4) that are output via the receive connecting circuit 132. In operation, the PD array 128 may then output electrical signals carrying a representation of the received channel wavelengths to a receive connecting circuit 132 by way of conductive traces 119 (which may be referred to as conductive paths).

Referring to FIGS. 2-8B an example optical transceiver module 200 is shown consistent with an embodiment of the present disclosure. The optical transceiver module 200 may be implemented as the optical transceiver module 100 of FIG. 1.

Figure 2:
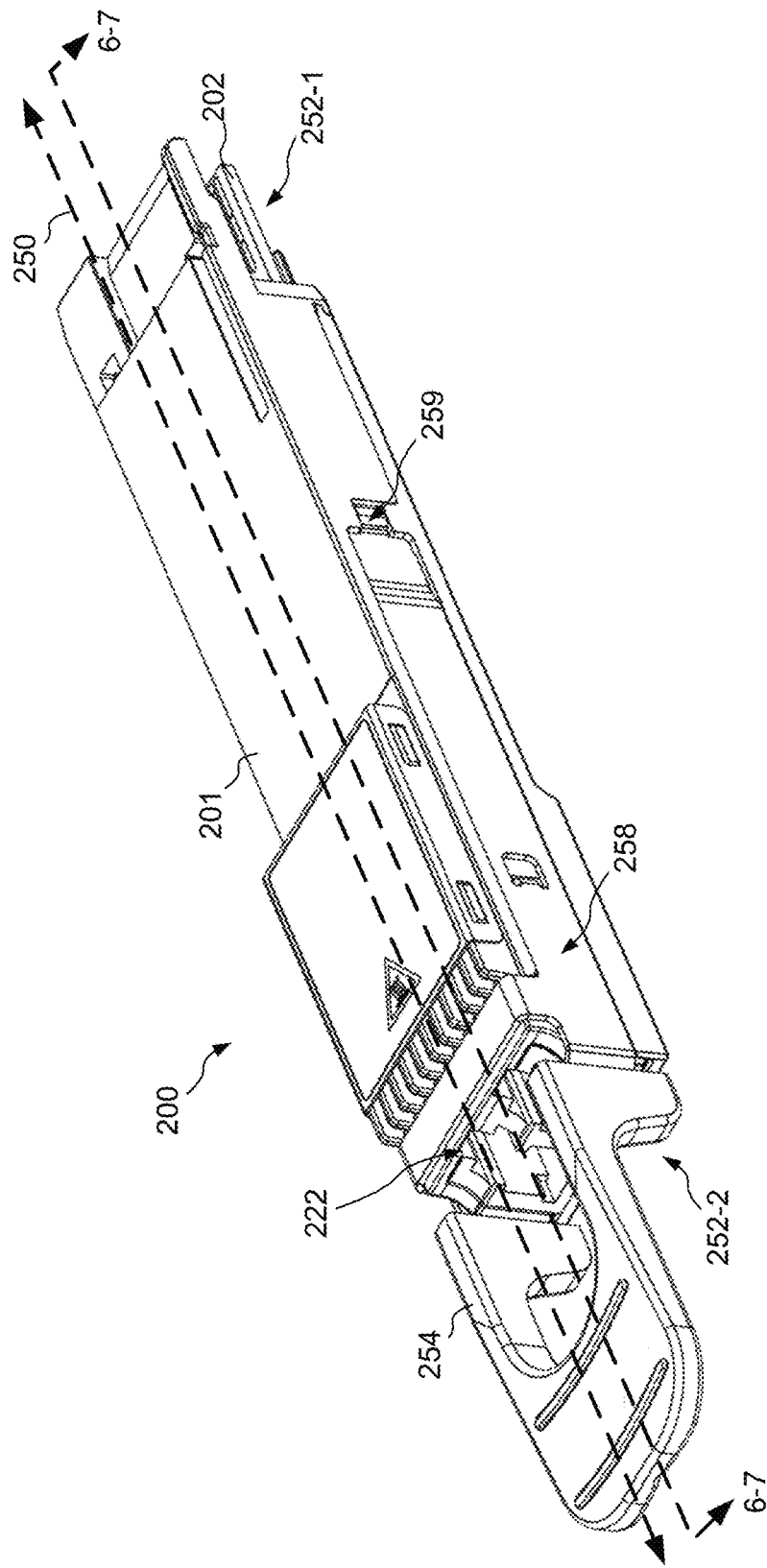
FIG. 2 is a perspective view of an optical transceiver module consistent with the present disclosure.

As shown in FIG. 2, the optical transceiver module 200 includes housing 201. In one preferred example, the optical transceiver module 200 includes the housing 201 implemented as a small form-factor pluggable (SFFP) housing. The optical transceiver module 200 is also preferably configured to send and receive four (4) different channel wavelengths and operates at speeds of at least 400 gigabits per second (Gb/s), although other configurations are within the scope of this disclosure. Note, aspects and features are equally applicable to other types of optical subassembly modules and not necessarily a multi-channel optical transceiver as shown and described variously herein. For example, aspects and features are equally applicable to transmitter-only, e.g., stand-alone TOSAs, receiver-only devices, e.g., stand-alone ROSAs, and/or single-channel devices.

As shown, the housing 201 of the optical transceiver module 200 comprises first and second housing portions 201-1 and 201-2 that couple together and define a cavity 255 (See FIG. 4) therebetween. The housing 201 includes a first end 252-1 disposed opposite a second end 252-2 along longitudinal axis 250.

Preferably, the first end 252-1 includes a portion of the substrate 202 extending therefrom to electrically couple with the external transmit and receive circuitry, e.g., via transmit connecting circuit 112 and receive connecting circuit 132 (See FIG. 1). The first end 252-1 may also be referred to as an electrical coupling end.

As shown, the second end 252-2 is configured to optically couple with external transmit waveguide 120 and external receive waveguide 134 (FIG. 1) via optical coupling ports 222. Preferably, the optical coupling ports 222 are implemented as LC receptacles to couple to the external transmit and receive waveguides 120, 134. The second end 252-2 may also be referred to herein as an optical coupling end.

The second end 252-2 further includes a handle 254 coupled to a locking arrangement 258. Preferably, the locking arrangement 258 and handle 254 allows for the housing 201 to be removably coupled into a transceiver cage and securely held/locked in place by a detent 259 or other feature of the locking arrangement 258. A user may then grip the handle 254 and supply a force along longitudinal axis 250 in a direction away from the transceiver cage to cause the locking arrangement 258 to disengage/unlock by displacing the detent 259, for example, and allow for the optical transceiver module 200 to be removed from the transceiver cage.

Figure 3:
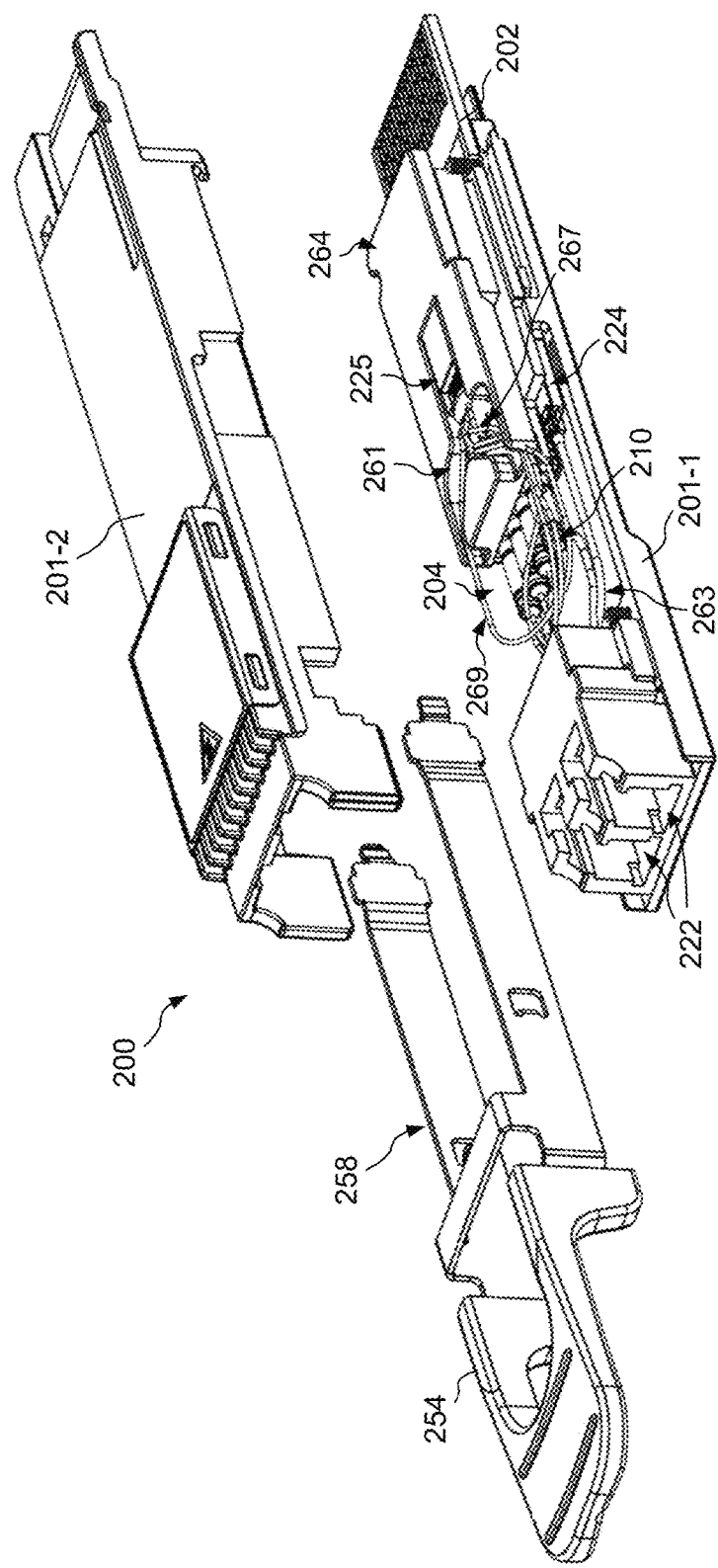
FIG. 3 shows the optical transceiver module of FIG. 2 partially exploded, in accordance with an embodiment of the present disclosure.

FIG. 3 shows the optical transceiver module 200 of FIG. 2 partially exploded in accordance with an embodiment. As shown, the substrate 202 is at least partially disposed in the cavity 255 (See FIG. 4) of the housing 201. The substrate 202 preferably includes at least a first component mounting surface 280-1 (See FIG. 4) for supporting TOSA and ROSA arrangements 204, 206 respectively, within the cavity 255. More preferably, the substrate 202 includes a second component mounting surface 280-2 disposed opposite the first component mounting surface 280-1 (See FIG. 7).

As further shown, the TOSA arrangement 204 includes a plurality of laser assemblies 210. Each laser assembly of the plurality of laser assemblies 210 may also be referred to herein as mini TOSAs. Each laser assembly of the plurality of laser assemblies 210 optically couples to an input of multiplexing device 225 by way of intermediate waveguides 267 preferably implemented as optical fibers as shown. The multiplexing device 225 further includes an output port optically coupled to the optical coupling ports 222 by way of an intermediate waveguide 269 preferably implemented as an optical fiber as shown. Preferably, the input and output ports of the multiplexing device 225 are located on the same side. Likewise, the demultiplexing device 224 of the ROSA arrangement 206 (See also FIG. 4) further includes an input port optically coupled to optical coupling ports 222 by way of an intermediate waveguide 263 preferably implemented as an optical fiber.

Figure 4:
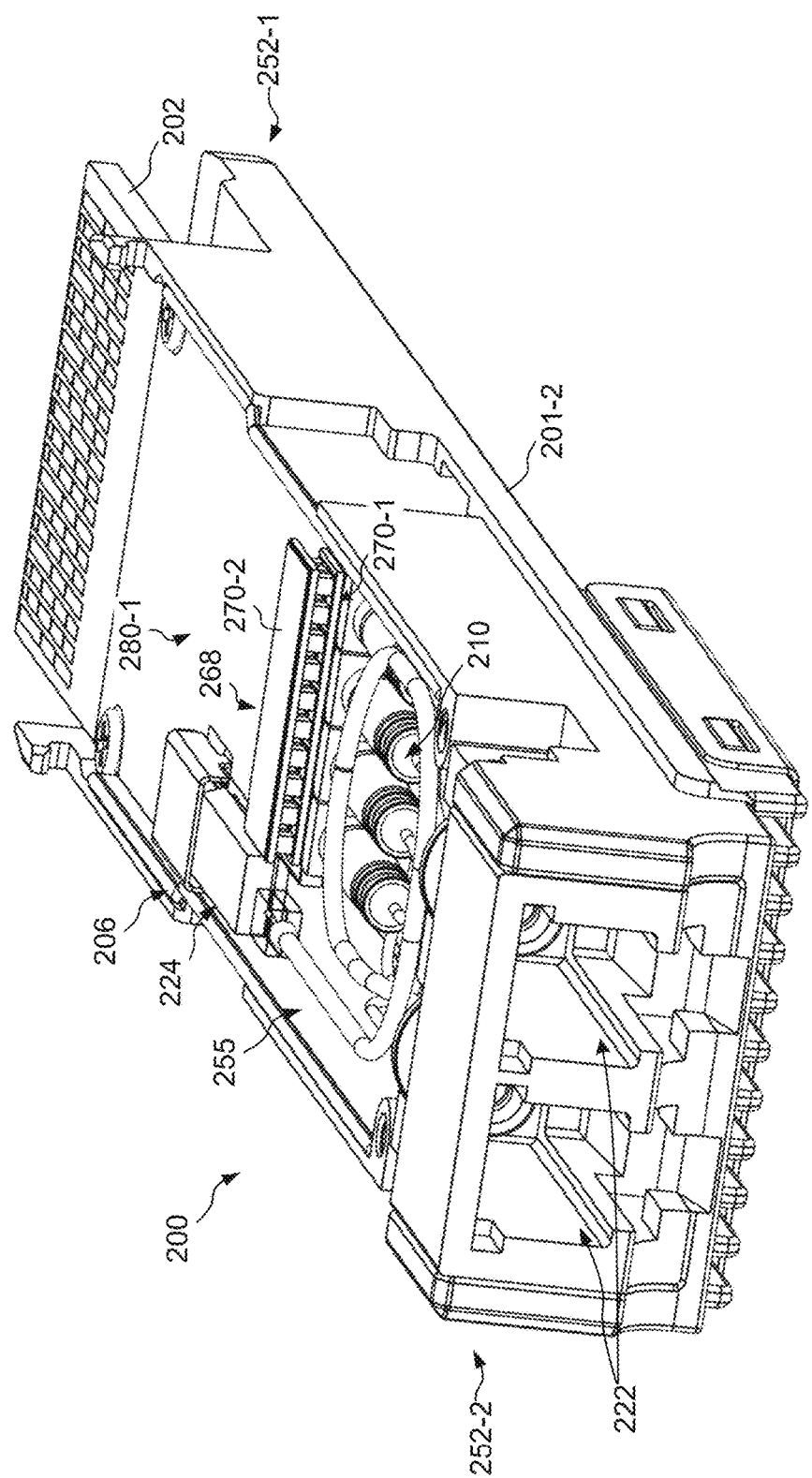
FIG. 4 shows another perspective view of the optical transceiver module of FIG. 2 with a first (or bottom) housing portion omitted, in accordance with an embodiment of the present disclosure.

Continuing on with FIG. 3, the optical transceiver module 200 includes a support structure 264 disposed within the cavity 255 (See FIG. 4). The support structure 264 preferably couples to and is supported by the substrate 202. The support structure 264 further defines an accommodation groove 261. The accommodation groove 261 defines a receptacle to receive at least a portion of the multiplexing device 225 therein. The accommodation groove 261 also further preferably defines a Y-shaped channel to allow for routing of intermediate waveguides 267 from the plurality of laser assemblies 210 to the input ports of the multiplexing device 225, and to allow for routing of the intermediate waveguide 269 to the optical coupling ports 222.

Figure 5:
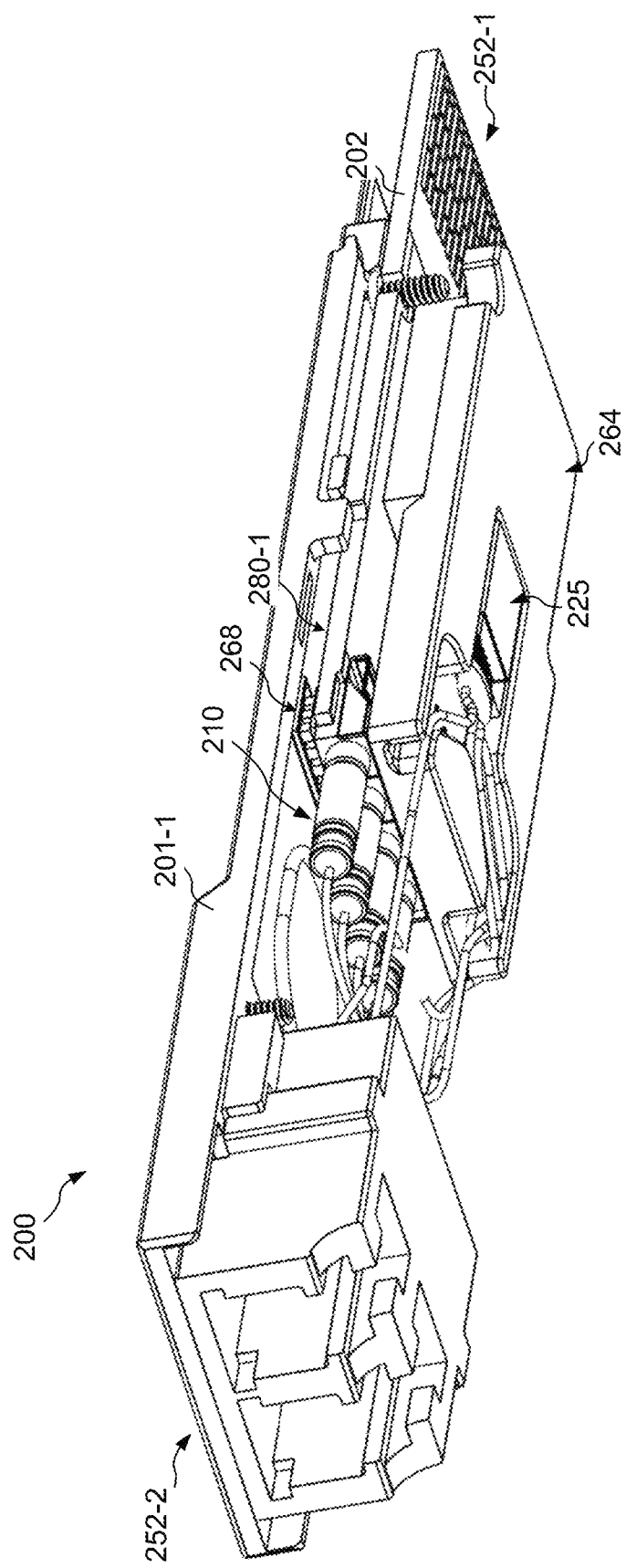
FIG. 5 shows another perspective view of the optical transceiver module of FIG. 2 with a second (or top) housing portion omitted, in accordance with an embodiment of the present disclosure.

Turning to FIGS. 4-5, FIG. 4 shows the optical transceiver module 200 of FIG. 2 inverted and with the first housing portion 201-1 omitted, and FIG. 5 shows the optical transceiver module 200 of FIG. 2 with the second housing portion 201-2 omitted.

As shown, the substrate 202 includes the first component mounting surface 280-1 disposed within the cavity 255 of the housing at a location proximate the first housing portion 201-1 (See FIG. 5), and preferably, the first component mounting surface 280-1 faces the first housing portion 201-1, e.g., when the first housing portion 201-1 is coupled to the second housing portion 201-2.

The first component mounting surface 280-1 is configured to couple to one or more components. For example, the demultiplexing device 224 of the ROSA arrangement 206 couples to and is supported by a first region of the first component mounting surface 280-1. In this example, the ROSA arrangement 206 may also be referred to as an on-board ROSA arrangement.

Further, a temperature control device 268 couples to and is supported by a second region of the first component mounting surface 280-1. As discussed in greater detail below, the second region of the first component mounting surface 280-1 of the substrate 202 defines at least a portion of a laser mounting region (also referred to as a TOSA mounting region) as discussed in greater detail below.

The temperature control device 268 preferably comprises a thermoelectric cooler having a plurality of semiconductor elements sandwiched/disposed between first and second plates 270-1, 270-2. The temperature control device 268 is also preferably used as a common/shared temperature control device by each of the plurality of laser assemblies 210. Thus, the temperature control device 268 may heat and/or cool the plurality of laser assemblies 210 collectively. However, the temperature control device 268 may be implemented as a plurality of temperature control devices, with each of the plurality of temperature control devices heating/cooling one or a plurality of associated laser assemblies.

Preferably, the temperature control device 268 is disposed adjacent an end of the substrate 202, and in particular, the end of the substrate 202 defining the laser coupling region. More preferably, the temperature control device 268 is disposed at an offset from the substrate 202 based on gap 286 discussed in further detail below. The temperature control device 268 can include a longitudinal axis that is substantially transverse relative to the longitudinal axis 250 (See FIG. 2) of the housing 201. For example, and as shown in FIG. 4, this allows the temperature control device 268 to extend across the width of the substrate 202 and allow for thermal coupling with each laser assembly of the plurality of laser assemblies 210.

The temperature control device 268 can electrically couple via conductors 272 (See FIG. 6) to the substrate 202, and more specifically, electrical terminals disposed on the first component mounting surface 280-1 of the substrate 202. Preferably, the temperature control device 268 is disposed in the cavity 255, with the cavity 255 being non-hermetically sealed. Thus, the temperature control device 268 can electrically couple to circuitry of the optical transceiver module 200 such as a controller and/or power rail, without the use of a feedthrough device.

Figure 6:
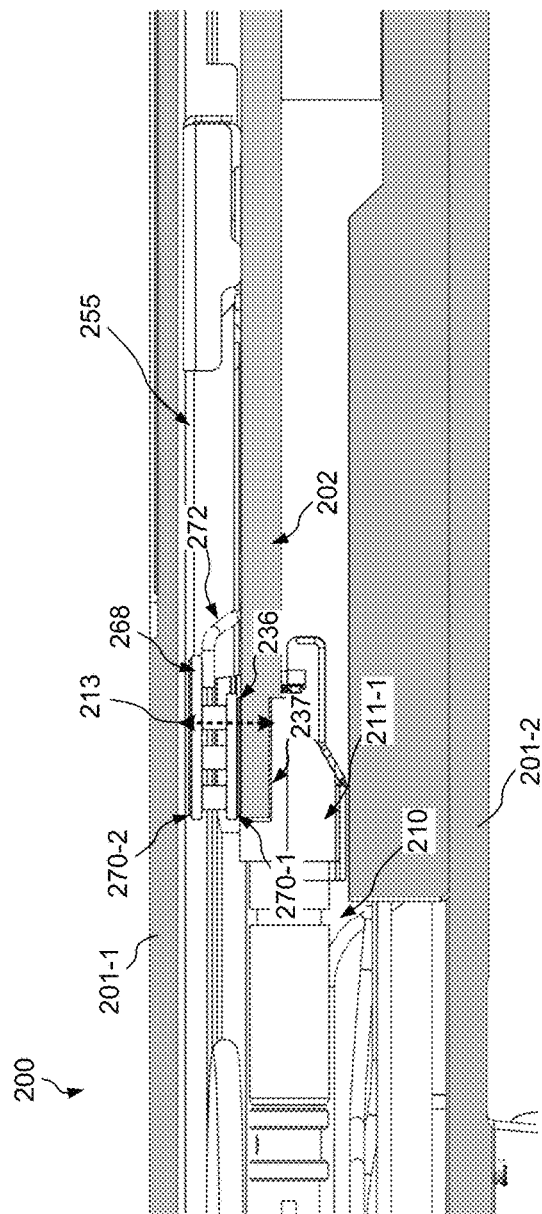
FIG. 6 shows a cross-sectional view of the optical transceiver module of FIG. 2 taken along line 6-7.

FIG. 6 shows an example cross-sectional view of the optical transceiver module 200 taken along line 6-7 of FIG. 2. In the preferred example of FIG. 6, the temperature control device 268 couples to the plurality of laser assemblies 210 and/or the first component mounting surface 280-1 by way of the first plate 270-1. More preferably, the temperature control device 268 (directly) thermally couples to the plurality of laser assemblies 210 by way of the first plate 270-1. The temperature control device 268 may then provide a first thermal communication path 213 that extends at least from the plurality of laser assemblies 210 to the temperature control device 268, and preferably, from the plurality of laser assemblies 210 to the first housing portion 201-1 for heat dissipation purposes.

The temperature control device 268 may also thermally couple to the substrate 202 via a second thermal communication path (not shown) that extends substantially parallel with the first thermal communication path 213 and that passes through a portion of the substrate 202 disposed between the temperature control device 268 and the plurality of laser assemblies 210. However, and as is discussed further below, the substrate 202 can include a layer of thermally insulating material disposed thereon and/or have a gap disposed between the substrate 202 and the temperature control device 268 to thermally isolate the substrate 202 from the temperature control device 268. Thus, the second thermal communication path can be configured to communicate substantially less heat than the first thermal communication path based on the layer of thermally insulating material and/or gap interrupting/obstructing the same.

As shown, the second plate 270-2 of the temperature control device 268 thermally couples to the first housing portion 201-1. Preferably, the second plate 270-2 of the temperature control device 268 directly thermally couples to the first housing portion 201-1. In this preferred example, the second plate 270-2 of the temperature control device 268 may therefore (directly) thermally couple with the first housing portion 210-1 to increase communication of heat.

Figure 7:
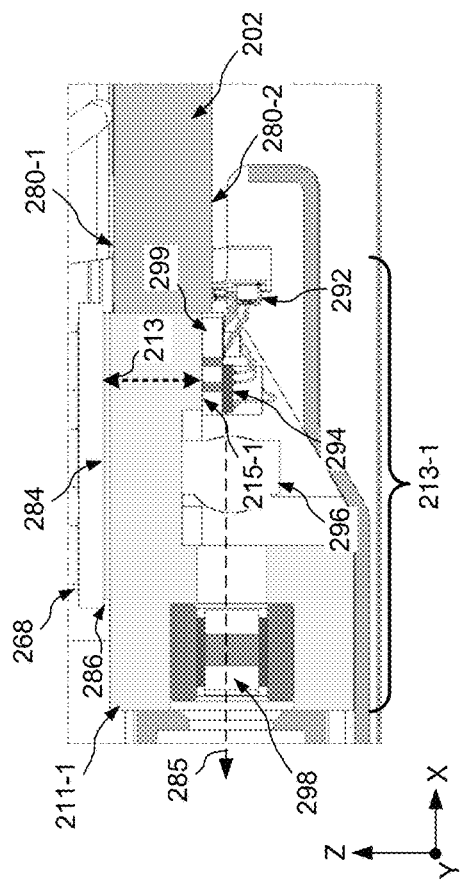
FIG. 7 shows another cross-sectional view of the optical transceiver module of FIG. 2 taken along line 6-7.

Preferably, each laser assembly of the plurality of laser assemblies 210 can be configured as a cuboid-type laser, such as shown. Each laser assembly of the plurality of laser assemblies 210 includes a corresponding base, e.g., shown in FIG. 8A as 211-1 to 211-4. For ease of description and clarity, a cross-sectional view of the base 211-1 taken along line 6-7 of FIG. 2 is shown in FIG. 7. Note, each laser assembly of the plurality of laser assemblies 210 preferably includes a substantially similar configuration, and the following aspects and features discussed with reference to FIG. 7 are equally applicable to each laser assembly of the plurality of laser assemblies 210.

The base 211-1 comprises a metal or other suitably rigid material, and preferably, a material with a relatively high thermal conductivity of 62 W/m-K or greater. As shown, the base 211-1 defines at least a first mounting surface 284 for coupling to and supporting the temperature control device 268. Preferably, the temperature control device 268 directly couples/mounts to the first mounting surface 284. As discussed in further detail below, each base 211-1 to 211-4 can define a pedestal to mount the temperature control device 268 at an offset to provide the gap 286 between the first component mounting surface 280-1 of the substrate 202 and the temperature control device 268. The gap 286 can provide thermal isolation between the substrate 202 and the temperature control device 268. This advantageously minimizes or otherwise reduces communication of heat from the plurality of laser assemblies 210 and/or the temperature control device 268 to the substrate 202, and by extension, reduces the potential for communicating heat to temperature-sensitive components mounted to the substrate 202.

Continuing on, the base 211-1 further provides a laser mounting surface 215-1, with the laser mounting surface 215-1 being disposed opposite the first mounting surface 284. As shown, the laser mounting surface 215-1 is configured to couple to and support at least a portion of laser arrangement 213-1 that includes laser diode 294. The laser diode 294 may be mounted/coupled directly to the laser mounting surface 215-1, or indirectly by way of a submount 299 as shown. Preferably, the laser diode 294 is implemented as an EML, and thus the laser arrangement 213-1 may also be referred to herein as an EML arrangement. The submount 299 is preferably implemented as the laser submount 299A or the laser submount 299B of FIGS. 9A and 12, respectively, although other configurations are within the scope of this disclosure.

The laser arrangement 213-1 can further include a monitor photodiode (MPD) 292, focus lens 296, and optical isolator 298. Each component of the laser arrangement 213-1 may be optically aligned along a light path 285. Light path 285 may therefore be formed by aligning the components of the laser arrangement 213-1 along the X and Y axis.

The plurality of laser assemblies 210 may therefore define a plurality of light paths, e.g., including light path 285, which extend substantially parallel with each other and substantially parallel with the longitudinal axis 250 of the housing 201 (See FIG. 2).

Figure 8A:
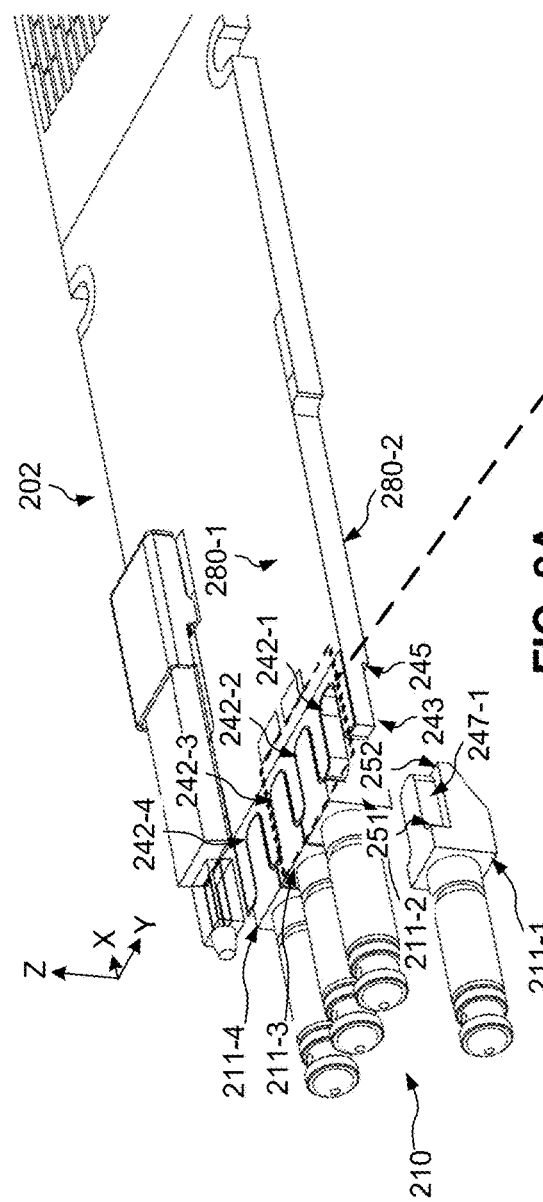
FIG. 8A shows a substrate and a plurality of laser assemblies suitable for use in the optical transceiver module of FIG. 2 in isolation, in accordance with an embodiment of the present disclosure.

Turning to FIG. 8A, the substrate 202 and plurality of laser assemblies 210 are shown in isolation and partially exploded. Note, the temperature control device 268 has been omitted merely for clarity. As shown, the substrate 202 preferably includes a plurality of openings 242-1 to 242-4. Each of the plurality of openings 242-1 to 242-4 can include a notched/grooved profile, such as shown, or may include other shapes and configurations.

The plurality of openings 242-1 to 242-4 generally define at least a portion of a laser coupling region (also referred to herein as a laser coupling section). The laser coupling region further preferably includes a recessed surface 243, with the recessed surface 243 providing a stepped profile. The recessed surface 243 can further define an alignment surface 245, with the alignment surface 245 extending substantially transverse relative to the first and second component mounting surfaces 280-1, 280-2.

Preferably, a first layer of thermally insulating material 236 (See FIG. 8B) is disposed on the first component mounting surface 280-1, and preferably, in the laser coupling region. The first layer of thermally insulating material 236 can comprise, for example, glass-reinforced epoxy laminate material commonly referred to as FR4, and preferably Copper (Cu). The first layer of thermally insulating material 236 may also be referred to as a layer of thermal shielding.

As shown in the preferred example of FIG. 8A, the first layer of thermally insulating material 236 is disposed between the temperature control device 268 and the first component mounting surface 280-1 of the substrate 202 (See FIG. 6). More preferably, the gap 286 is disposed between the temperature control device 268 and the first layer of thermally insulating material 236 to provide additional thermal isolation between the temperature control device 268 and the substrate 202.

One or more additional layers of thermally insulating material may also be disposed in other areas of the laser coupling region. For example, a second layer of thermally insulating material 237 may be disposed on the recessed surface 243 (See FIG. 6). In another example, a layer of thermally insulating material may also be disposed on surfaces defining the plurality of openings 242-1 to 242-4.

Figure 8B:
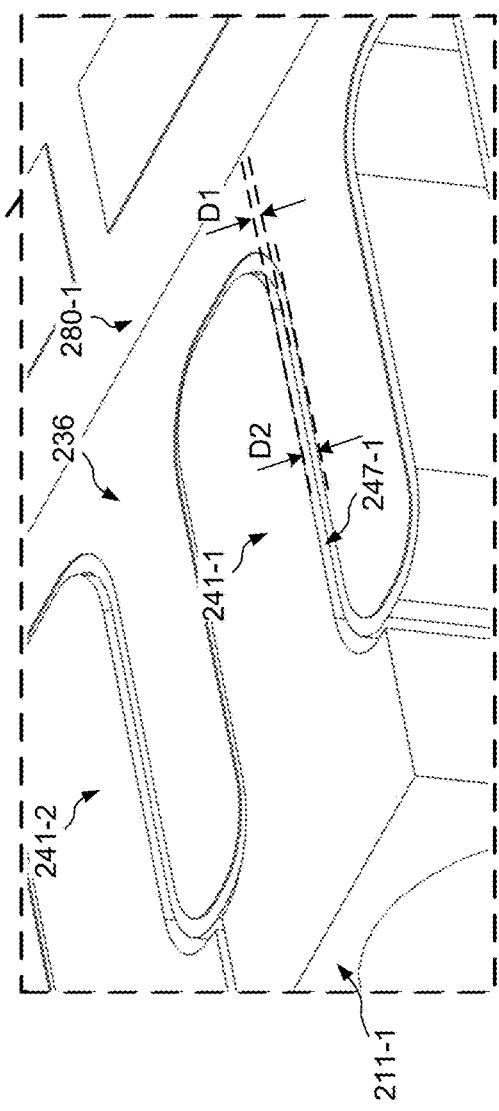
FIG. 8B shows an enlarged portion of the substrate and the plurality of laser assemblies shown in FIG. 8A, in accordance with an embodiment of the present disclosure.

As shown in FIG. 8B, the base of each laser assembly of the plurality of laser assemblies 210 is configured to extend at least partially through a corresponding opening of the plurality of openings 242-1 to 242-2 to thermally couple to the temperature control device 268. For example, the base 211-1 includes a projection 247-1 that extends from the base 211-1. The projection 247-1 preferably includes a tapered profile as shown with a shape that generally corresponds with the opening 242-1. The projection 247-1 and opening 242-1 may therefore form a tongue and groove arrangement. The alignment surface 245 may then act as a mechanical end stop to engage surface 251 and prevent further movement along the X axis. Surface 252 of the base 211-1 extends substantially transverse relative to the surface 251 and provides a mating surface to engage recessed surface 243 and prevent further movement along the Z axis. Thus, the plurality of openings 242-1 to 242-2 of the laser coupling section allows for mechanical alignment of the plurality of laser assemblies 210 during mounting of the same.

Preferably, each of the plurality of laser assemblies 210 includes each associated base having a mounting surface that extends substantially parallel with the first component mounting surface 280-1 of the substrate 202, such as is more clearly shown in FIG. 8B. For example, the projection 247-1 of base 211-1 is configured with an overall height that causes a mounting surface 241-1 of the projection 247-1 to have an offset of D1 relative to the first component mounting surface 280-1, and an offset of D2 relative to the first layer of thermally insulating material 236. Preferably, the offset D1 is between 10 microns and 40 microns. Likewise, the offset D2 is preferably between 0 microns and 10 microns.

Accordingly, each laser assembly of the plurality of laser assemblies 210 preferably defines a mounting surface, such as mounting surfaces 241-1, that extends substantially coplanar with each other such that the plurality of laser assemblies 210 collectively provide a mounting surface for (directly) coupling to and supporting the temperature control device 268. More preferably, the mounting surface collectively provided by the plurality of laser assemblies 210 allows for thermally coupling to the temperature control device 268 while also providing thermal isolation between the temperature control device 268 and the substrate 202, e.g., based on offsets D1/D2 and/or gap 286. The projection of each of the plurality of laser assemblies 210, e.g., projection 247-1, may also be referred to as a temperature control device mounting pedestal or simply a pedestal.

Figure 9A:
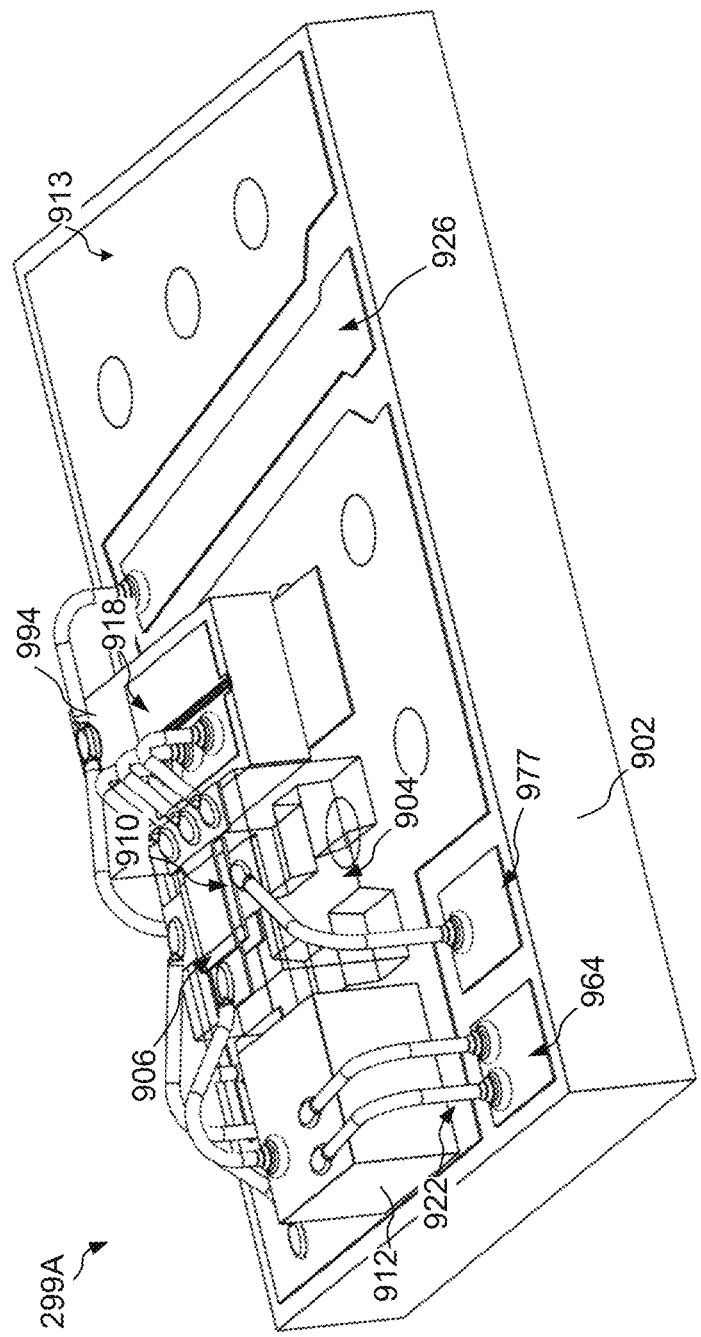
FIG. 9A shows a perspective view of an example laser diode (LD) submount suitable for use in the optical transceiver module of FIG. 2, in accordance with an embodiment of the present disclosure.
Figure 9B:
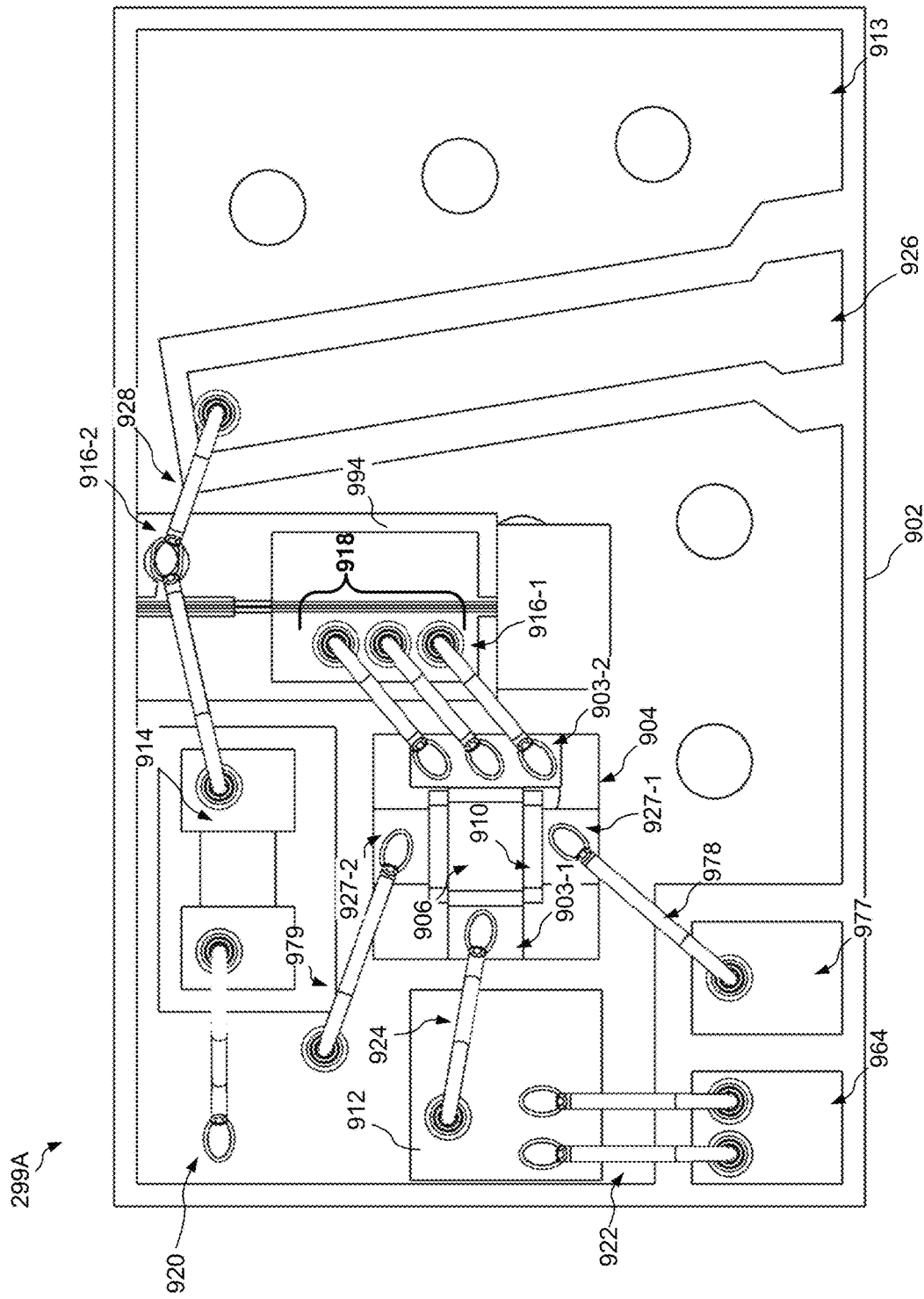
FIG. 9B shows a top view of the LD submount of FIG. 9A, in accordance with an embodiment of the present disclosure.

Referring to FIGS. 9A-9B, a laser submount 299A is shown in accordance with an embodiment of the present disclosure. The laser submount 299A may also be referred to as an LD submount. The example laser submount 299A is suitable for use in optical subassembly modules, such as the optical transceiver module 100/200 of FIGS. 1 and 2 discussed above.

As shown, the laser submount 299A includes a base 902. The base 902 may be any suitable substrate, and preferably, is a ceramic substrate. The base 902 preferably includes a component mounting surface 913 that is substantially planar/flat.

The laser submount 299A includes a plurality of components coupled to the component mounting surface 913 provided by the base 902. In particular, the laser submount 299A preferably includes a heater device 904, a filtering capacitor 912, and the laser diode 994 coupled to and supported by the component mounting surface 913. The laser diode 994 preferably comprises an EML, although other types of laser devices are within the scope of this disclosure.

As shown, the laser diode 994 includes a lasing region 916-1 and a modulator region 916-2 (See FIG. 9B). The lasing region 916-1 electrically couples with external driving circuitry (also referred to herein as external LD driving circuitry, or simply LD driving circuitry) via a first electrically conductive path that extends between the lasing region 916-1 and the terminal/pad 964. Preferably, and as discussed in greater detail below, the heater device 904 provides at least a portion of the first electrically conductive path to allow for the heater device 904 to communicate heat to the laser diode 994, and more specifically, the lasing region 916-1 of the laser diode 994.

In more detail, the first electrically conductive path preferably includes the terminal/pad 964 disposed on the component mounting surface 913 of the base 902 to receive a direct current (DC) bias signal from a power supply. Preferably, the electrical terminal 964 electrically couples to the filtering capacitor 912 by way of one or more electrical interconnects 922. More preferably, the one or more electrical interconnects 922 are implemented as wire bond(s).

The filtering capacitor 912 can be configured to, for instance, bypass noise from a DC power supply that provides the DC bias signal. The filtering capacitor 912 electrically couples to the heater device 904, and more particularly, an electrical conductor 906 disposed on the heater device 904. As discussed in further detail below, the heater device 904 includes a resistive heating element 910 thermally coupled to, and electrically isolated from, the electrical conductor 906.

The electrical conductor 906 provides a first electrical terminal 903-1 at an end/region adjacent the filtering capacitor 912. The first electrical terminal 903-1 of the electrical conductor 906 electrically couples to the filtering capacitor 912 by way of at least one electrical interconnect 924. Preferably, the at least one electrical interconnect 924 comprises one or more wire bonds, such as shown in FIG. 9B. The electrical conductor 906 further provides a second electrical terminal 903-2 at an end/region adjacent the laser diode 994. The second electrical terminal 903-2 of the electrical conductor 906 electrically couples to the lasing region 916-1 of the laser diode 994 by way of at least one electrical interconnect 918. Preferably, the at least one electrical interconnect 918 comprises one or more wire bonds, and more preferably, the at least one electrical interconnect 918 comprises a plurality of wire bonds to increase communication of heat generated by the resistive heating element 910 to the lasing region 916-1 of the laser diode 994.

Preferably, the second electrical terminal 903-2 of the electrical conductor 906 includes an overall surface area that is larger than that of the first electrical terminal 903-1. For example, the overall surface area of the second electrical terminal 903-2 may be at least twice the overall surface area of the first electrical terminal 903-1. Thus, the second electrical terminal 903-2 may be configured to support a plurality of electrical interconnects such as wire bonds as shown in FIGS. 9A and 9B.

The modulator region 916-2 of the laser diode 994 electrically couples with external driving circuitry via a second electrically conductive path that extends between the modulator region 916-2 and the electrical terminal/pad 926. The electrical terminal 926 preferably comprises a layer of metal disposed on the component mounting surface 913. In particular, the second electrically conductive path includes the electrical terminal 926 to receive an electrical signal from external driving circuitry for driving the modulator region 916-2 of the laser diode 994. The electrical terminal 926 electrically couples to the modulator region 916-2 by way of an electrical interconnect 928. Preferably, the electrical interconnect 928 comprises one or more wire bonds, such as show in FIG. 9B.

The second electrically conductive path further includes a matching resistor 914 (also referred to herein as a matching resistor network) electrically coupled between a ground plane 920 and the modulator region 916-2. The ground plane 920 preferably comprises at least one layer of metal disposed on the component mounting surface 913. More preferably, the ground plane 920 comprises a coplanar ground plane formed of an electrically conductive material such as Copper (Cu). Preferably, the matching resistor 914 couples to the ground plane 920 and the modulator region 916-2 of the laser diode 994 via an electrical interconnect, such as wire bonds as shown in FIG. 9B. The matching resistor 914 comprises, for example, one or more resistors and preferably one or more surface mountable device (SMDs) such as a 50 Ohm resistor SMD device.

Figure 10A:
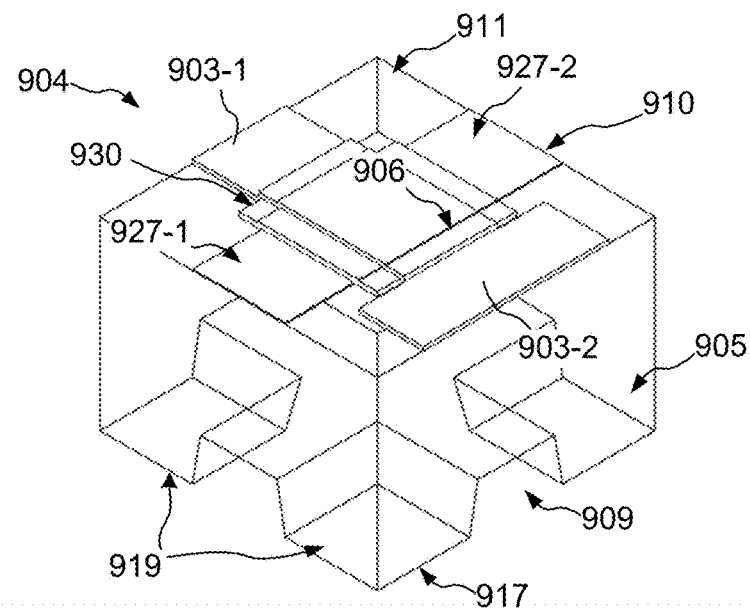
FIG. 10A shows a perspective view of an example heater device suitable for use with the LD submount of FIG. 9A, in accordance with an embodiment of the present disclosure.
Figure 10B:
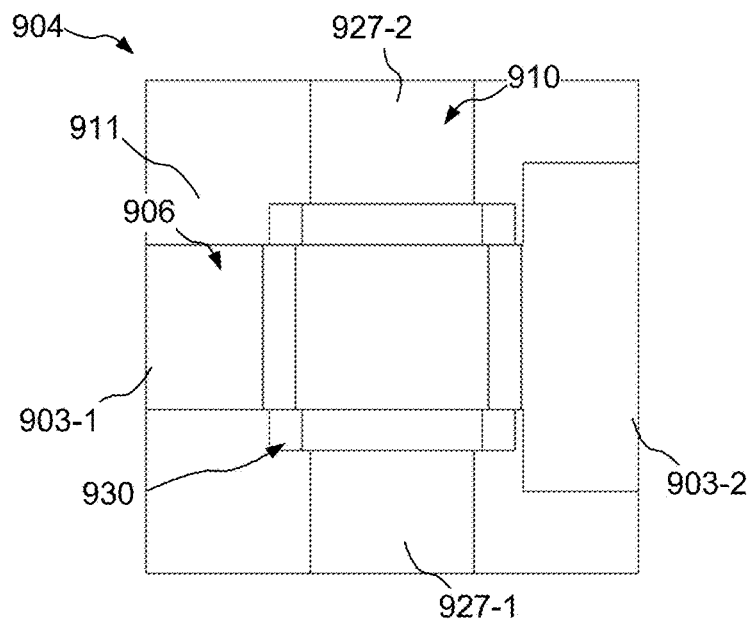
FIG. 10B shows a top view of the heater device of FIG. 10A, in accordance with an embodiment of the present disclosure.

FIGS. 10A-10B show the heater device 904 of FIGS. 9A-9B in isolation, in accordance with an embodiment of the present disclosure. As shown, the heater device 904 includes a base 905 with a cuboid shape. The base 905 can include other shapes and profiles, depending on a desired configuration. The base 905 preferably comprises a material with a thermal conductivity of 1.5 Watts per meter-Kelvin (W/m-K) or less. One such example material includes Quartz, although this disclosure is not limited in this regard.

The base 905 preferably defines at least one mounting surface, such as mounting surface 911. The mounting surface 911 is preferably disposed opposite mating surface 917 by which the heater device 904 couples to the base 902 of the laser submount 299A (See FIG. 9A). As further shown, the base 905 can include at least one groove 909. The at least one groove 909 can be configured to provide projections/feet 919 for mounting to the laser submount 299A, and for providing increased thermal isolation between the resistive heating element 910 and the laser submount 299A.

As further shown, the base 905 of the heater device 904 includes a plurality of components disposed on the mounting surface 911. As shown, this includes a resistive heating element 910 disposed on the mounting surface 911. The resistive heating element 910 preferably includes a layer of a metal 929 disposed on the mounting surface 911, which can be more clearly seen in FIG. 11A. The resistive heating element 910 further includes first and second electrical terminals 927-1, 927-2 formed of a second metal. The first and second electrical terminals 927-1, 927-2 are preferably disposed on opposite sides of the layer of metal 929. Preferably, the first and second electrical terminals 927-1, 927-2 comprise a different metal than that of the layer of metal 929. The first and second terminals 927-1, 927-2 of the resistive heating element 910 can electrically couple to external driving circuitry via, for example, electrical interconnects 978 and 979, and electrical terminal 977 (See FIG. 9B). Preferably the electrical interconnects 978 and 979 each comprise one or more wire bonds.

Preferably, the first and second electrical terminals 927-1, 927-2 directly electrically couple to the layer of metal 929. One example material for the layer of metal 929 includes Tantalum nitride (TaN) although the layer of metal 929 can comprise other metals such as NiCr (Nichrome) or a metal with an electrical resistivity of $1.5 \times 10\text{-}6\,\Omega\cdot m$ or greater. Preferably, the first and second electrical terminals 927-1, 927-2 comprise a metal with an electrical resistivity less than that of the layer of metal 929, and more preferably, a metal with an electrical resistivity of less than $16.4 \times 10\text{-}8\,\Omega\cdot m$. One example material for the second metal of the first and second electrical terminals 927-1, 927-2 includes Gold (Au). The resistive heating element 910 may therefore be configured to generate heat based on an electrical signal provided to the layer of metal 929 (See FIG. 11A) by way of the first and second electrical terminals 927-1, 927-2.

The base 905 further preferably includes a layer of electrically insulating material 930 disposed on the mounting surface 911, and more preferably, disposed at least partially on the resistive heating element 910. The layer of electrically insulating material 930 can comprise, for example, at least one of Silicon dioxide ($SiO_2$), Aluminum Nitride (AlN), Aluminum Oxide ($Al_2O_3$), Silicon Carbide (SiC), Silicon Nitride ($Si_3N_4$), and/or Polyimide.

The base 905 further preferably includes the electrical conductor 906 disposed on the mounting surface 911, and more preferably, disposed at least partially on the layer of electrically insulating material 930. In this preferred example, the layer of electrically insulating material 930 electrically isolates the electrical conductor 906 from the layer of metal 929 of the resistive heating element 910, and thermally couples the resistive heating element 910 to the electrical conductor 906.

Heater device 904 may then preferably communicate heat generated by the resistive heating element 910 to, for example, the lasing region 916-1 of the laser diode 994 via a thermal communication path that extends through the layer of electrically insulating material 930 and the electrical conductor 906 to the lasing region 916-1 of the laser diode 994 by way of the at least one electrical interconnect 918 (See FIG. 9B). Accordingly, the at least one electrical interconnect 918 that electrically couple the electrical conductor 906 to the lasing region 916-1 of the laser diode 994 can communicate both a driving signal and heat to maintain the lasing region 916-1 of the laser diode 994 at a target temperature. One such target temperature includes at least 20 degrees Celsius.

Figure 11A:
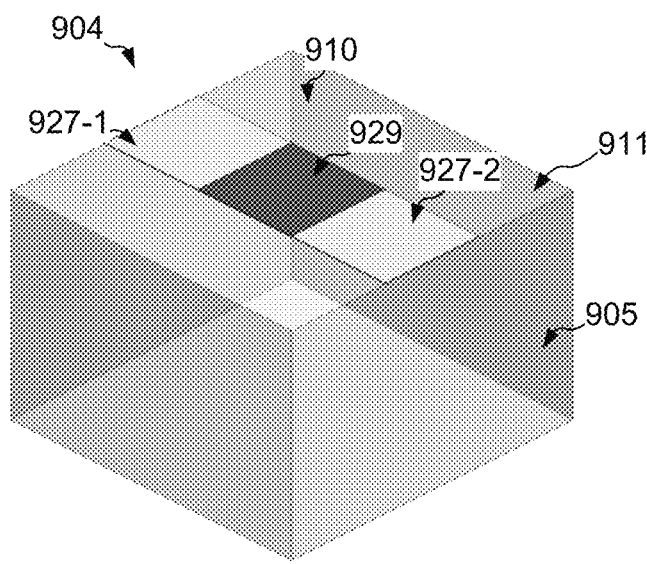
FIGS. 11A-11C show an example process for forming the heater device of FIG. 10A in accordance with an embodiment.
Figure 11B:
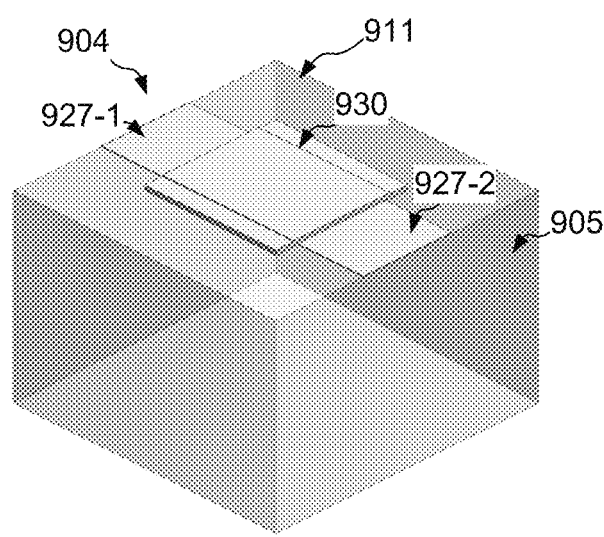
Figure 11C:
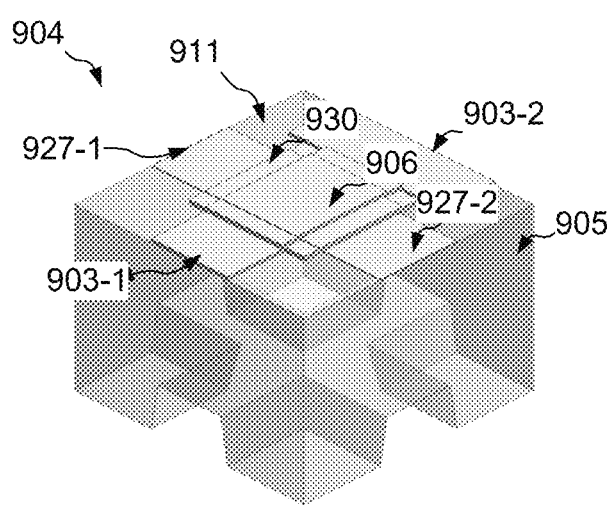

FIGS. 11A-11C illustrate an example process to form the heater device 904, in accordance with an embodiment. As shown in FIG. 11A, the resistive heating element 910 gets disposed on the base 905, and preferably, across the mounting surface 911 of the base 905 from edge-to-edge. More preferably, the resistive heating element 910 includes the layer of metal 929 disposed at a midpoint of the base 905, and the first and second electrical terminals 927-1, 927-2 disposed on opposite sides of the layer of metal 929. As shown in FIG. 11B, the layer of electrically insulating material 930 gets disposed on to the base 905, and preferably, on to at least the layer of metal 929 of the resistive heating element 910. More preferably, the layer of electrically insulating material 930 gets disposed on the layer of metal 929 and the mounting surface 911. As shown in FIG. 11C, the electrical conductor 906 may then be disposed on the base 905, and preferably, on the layer of electrically insulating material 930. More preferably, the electrical conductor 906 extends across the mounting surface 911 of the base 905, e.g., edge-to-edge, along an axis that is substantially transverse relative to the axis along which the resistive heating element 910 extends.

Figure 12:
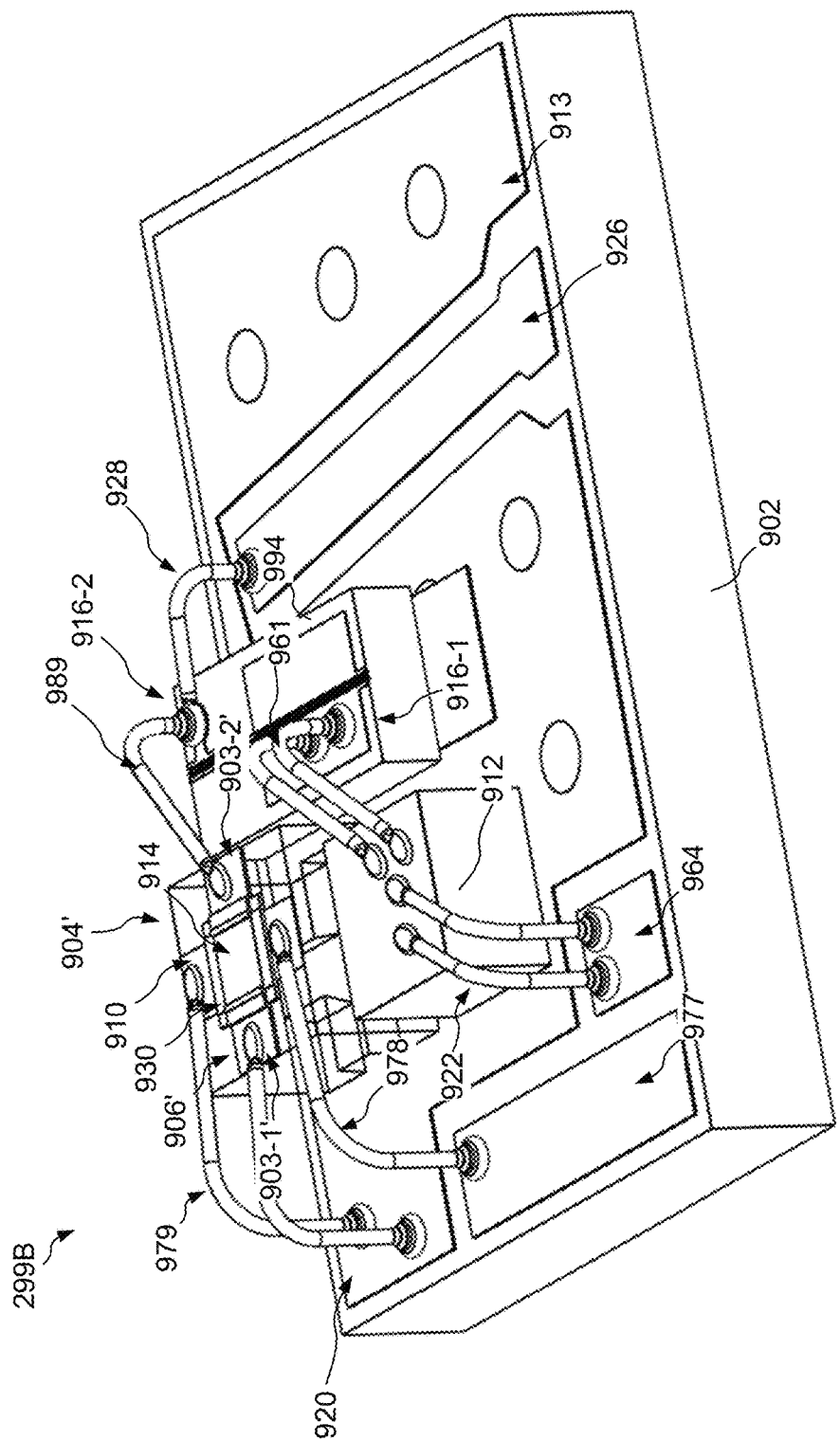
FIG. 12 shows another perspective view of an LD submount suitable for use in the optical transceiver module of FIG. 2, in accordance with an embodiment of the present disclosure.

FIG. 12 shows another example laser submount 299B in accordance with an embodiment of the present disclosure. The laser submount 299B includes a substantially similar configuration to that of the laser submount 299A of FIGS. 9A-9B, the description of which will not be repeated for brevity.

However, as shown in FIG. 12, the laser submount 299B provides a first electrically conductive path that couples the modulator region 916-2 to external driving circuitry based at least in part on the heater device 904'. Preferably, the first electrically conductive path includes electrical terminal 926 that couples to the modulator region 916-2 by way of an electrical interconnect 928, which is preferably implemented as one or more wire bonds as shown. The first electrically conductive path further includes at least one matching resistor 914 that define a portion of the electrical conductor 906'. The electrical conductor 906' can comprise a metal, such as Gold (Au) or Copper (Cu), and provides first and second electrical terminals 903-1' and 903-2'. The first electrical terminal 903-1' electrically couple to the ground plane 920 via one or more electrical interconnects, and preferably, via at least one electrical interconnect implemented as a wire bond. Likewise, the second electrical terminal 903-2' electrically couples to the modulator region 916-2 via one or more electrical interconnects, and preferably, via at least one electrical interconnect implemented as a wire bond.

The laser submount 299B preferably includes a second electrically conductive path disposed thereon. The second electrically conductive path electrically couples the lasing region 916-1 of the LD 994 to external LD driving circuitry. For example, as shown in FIG. 12, the second electrically conductive path extends from the electrical terminal 964 to the filtering capacitor 912 by way of electrical interconnects 922, and from the filtering capacitor 912 to the lasing region 916-1 of the LD 994 by way of electrical interconnects 961. The electrical interconnects 922, 961 are preferably implemented as wire bonds.

The heater device 904' can include a substantially similar configuration to that of the heater device 904 of FIGS. 9A-9B, the description of which is equally applicable to the heater device 904' and will not be repeated for brevity. However, and as shown, the heater device 904 includes the electrical conductor 906' being implemented in part by the at least one matching resistor 914. Preferably, the at least one matching resistor 914 comprises SMD-type resistors, and more preferably, a 50 ohm SMD.

In addition, and as shown, the second electrical terminal 903-2' preferably includes an overall surface area that is substantially equal to the overall surface area of the first electrical terminal 903-1'. Preferably, the second electrical terminal 903-2' includes an overall surface area sufficient to support and couple to a single electrical interconnect 989, such as shown, although this disclosure is not limited in this regard. The electrical interconnect 989 preferably comprises a wire bond and can be used to communicate heat generated from the resistive heating element 910 of the heater device 904' to the modulator region 916-2 via a thermal communication path that extends through the first layer of electrically insulating material 930, the electrical conductor 906' (and more preferably the at least one matching resistor 914), and the electrical interconnect 989. The electrical interconnect 989 may therefore both provide an impedance matching scheme for the modulator region 916-2 of the laser diode 994 as well as heat to maintain a target temperature of the modulator region 916-2 of the laser diode 994. One such target temperature includes at least 20 degrees Celsius.

The heater device 904' may be formed via a process substantially similar to the process discussed above with regard to FIGS. 11A-C. However, the process can include disposing the at least one matching resistor 914 on the base 905 when forming the electrical conductor 906/906'. Preferably, the at least one matching resistor 914 is disposed at a midpoint/center of the base 905, and more preferably, directly electrically coupled to the first and second first and second electrical terminals 903-1', 902-2' and on the first layer of the electrically insulating material 930.

In accordance with another aspect of the present disclosure an optical subassembly module is disclosed. The optical subassembly module comprising a housing defining a cavity, a substrate at least partially disposed in the cavity, a thermoelectric cooler coupled to the substrate, at least one laser assembly coupled to the substrate, wherein the thermoelectric cooler is thermally coupled to the at least one laser assembly and thermally isolated from the substrate.

In accordance with another aspect of the present disclosure an optical transceiver module is disclosed. The optical transceiver module comprising a housing defining a cavity, a substrate at least partially disposed in the cavity, a thermoelectric cooler coupled to the substrate within the cavity, a transmitter optical subassembly (TOSA) arrangement comprising at least one laser assembly coupled to the substrate within the cavity, wherein the thermoelectric cooler is thermally coupled to the at least one laser assembly and thermally isolated from the substrate, and a receiver optical subassembly (ROSA) arrangement coupled to the substrate within the cavity.

In accordance with another aspect of the present disclosure a heater device for use within transmitter optical subassemblies (TOSAs) is disclosed. The heater device comprising a base, a resistive heating element disposed on the base, an electrical conductor disposed at least partially on the resistive heating element, the electrical conductor to electrically connect a laser diode (LD) with associated LD driving circuitry, a layer of electrically insulating material disposed between the electrical conductor and the resistive heating element, and wherein the layer of electrically insulating material thermally couples the resistive heating element to the electrical conductor to communicate heat generated by the resistive heating element to the LD via the electrical conductor, and wherein the layer of electrically insulating material electrically isolates the resistive heating element from the electrical conductor.

In accordance with another aspect of the present disclosure a laser submount for use within transmitter optical subassemblies (TOSAs) or transmitters is disclosed. The laser submount comprising a substrate, a laser diode (LD) coupled to the substrate, a first electrically conductive path disposed on the substrate to electrically couple the LD to LD driving circuitry, and a heater device disposed on the substrate, the heater device having a resistive heating element and an electrical conductor thermally coupled to each other, the electrical conductor configured to provide at least a portion of the first electrically conductive path to electrically couple the LD with the LD driving circuitry and configured to communicate heat from the resistive heating element to the LD, wherein the resistive heating element is electrically isolated from the electrical conductor.

In accordance with another aspect of the present disclosure an optical transceiver module is disclosed. The optical transceiver module comprising a housing, a transceiver substrate disposed at least partially within the housing, at least one transmitter optical subassembly (TOSA) assembly coupled to the transceiver substrate, the at least one TOSA assembly comprising a laser submount, a laser diode (LD) coupled to the laser submount, a first electrically conductive path disposed on the laser submount to electrically couple the LD to LD driving circuitry, a heater device disposed on the laser submount, the heater device providing at least a portion of the first electrically conductive path and configured to communicate heat to the LD via one or more wire bonds, and a receiver optical subassembly (ROSA) arrangement coupled to the transceiver substrate.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. An optical subassembly module comprising:
   a housing defining a non-hermetically sealed cavity;
   a substrate at least partially disposed in the non-hermetically sealed cavity and comprising at least a first component mounting surface and a second component mounting surface opposite the first component mounting surface;

a thermoelectric cooler coupled to and supported by the first component mounting surface of the substrate, wherein an entirety of the thermoelectric cooler is disposed in the non-hermetically sealed cavity;

a plurality of laser assemblies coupled to the second component mounting surface of the substrate, wherein an entirety of the laser assemblies is disposed in the non-hermetically sealed cavity;

wherein the thermoelectric cooler is thermally and directly coupled to the plurality of laser assemblies through a plurality of openings in the substrate and thermally isolated from the substrate, wherein a layer of thermally insulating material is disposed between the first component mounting surface of the substrate and the thermoelectric cooler to thermally isolate the substrate from the thermoelectric cooler; and wherein the thermoelectric cooler thermally couples the plurality of laser assemblies to the housing via a thermal communication path that extends in the non-hermetically sealed cavity from the plurality of laser assemblies, through the thermoelectric cooler and to the housing.

2. The optical subassembly module of claim 1, wherein the layer of thermally insulating material comprises glass-reinforced epoxy laminate material or Copper.

3. The optical subassembly module of claim 1, wherein each laser assembly of the plurality of laser assemblies defining a pedestal that extends through a corresponding opening of the substrate to thermally couple to and support the thermoelectric cooler.

4. The optical subassembly module of claim 1, wherein at least one of the plurality of laser assemblies comprises an electro-absorption modulated laser (EML).

5. The optical subassembly module of claim 1, wherein the substrate comprises a printed circuit board assembly (PCBA).

6. The optical subassembly module of claim 1 implemented as an optical transceiver module configured to transmit and receive at least four (4) different channel wavelengths.

7. An optical transceiver module comprising:
a housing defining a non-hermetically sealed cavity;
a substrate at least partially disposed in the non-hermetically sealed cavity and comprising at least a first component mounting surface and a second component mounting surface opposite the first component mounting surface;

a thermoelectric cooler coupled to the substrate within the non-hermetically sealed cavity of the housing and supported by the first component mounting surface of the substrate, wherein an entirety of the thermoelectric cooler is disposed in the non-hermetically sealed cavity;

a transmitter optical subassembly (TOSA) arrangement comprising a plurality of laser assemblies coupled to the second component mounting surface of the substrate within the non-hermetically sealed cavity, wherein an entirety of the laser assemblies is disposed in the non-hermetically sealed cavity, and wherein the thermoelectric cooler is thermally and directly coupled to the plurality of laser assemblies through a plurality of openings in the substrate and thermally isolated from the substrate, wherein a layer of thermally insulating material is disposed between the first component mounting surface and the thermoelectric cooler to thermally isolate the substrate from the thermoelectric cooler;

a receiver optical subassembly (ROSA) arrangement coupled to the first component mounting surface of the substrate within the cavity; and wherein the thermoelectric cooler thermally couples the plurality of laser assemblies to the housing via a thermal communication path that extends in the non-hermetically sealed cavity from the plurality of laser assemblies, through the thermoelectric cooler and to the housing.

8. The optical transceiver module of claim 7, wherein the layer of thermally insulating material comprises glass-reinforced epoxy laminate material or Copper.

9. The optical transceiver module of claim 7, wherein at least one of the plurality of laser assemblies comprises an electro-absorption modulated laser.

10. The optical subassembly module of claim 1, further comprising at least one optical coupling receptacle optically coupled to the plurality of laser assemblies, wherein the optical coupling receptacle is coupled to the housing and disposed at least partially in the non-hermetically sealed cavity.

11. The optical transceiver module of claim 7, further comprising at least one optical coupling receptacle optically coupled to the TOSA arrangement and/or the ROSA arrangement, wherein the optical coupling receptacle is coupled to the housing and disposed at least partially in the non-hermetically sealed cavity.

* * * * *